United States Patent
Wang et al.

(10) Patent No.: US 12,435,416 B2
(45) Date of Patent: Oct. 7, 2025

(54) COMPOSITIONS AND METHODS USING SAME FOR NON-CONFORMAL DEPOSITION OF SILICON CONTAINING FILMS

(71) Applicant: VERSUM MATERIALS US, LLC, Tempe, AZ (US)

(72) Inventors: Meiliang Wang, Shanghai (CN); Tingmin Wang, Tempe, AZ (US); Xinjian Lei, Vista, CA (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 17/641,156

(22) PCT Filed: Sep. 4, 2020

(86) PCT No.: PCT/US2020/049315
§ 371 (c)(1),
(2) Date: Mar. 8, 2022

(87) PCT Pub. No.: WO2021/050368
PCT Pub. Date: Mar. 18, 2021

(65) Prior Publication Data
US 2022/0333241 A1   Oct. 20, 2022

Related U.S. Application Data

(60) Provisional application No. 62/898,047, filed on Sep. 10, 2019.

(51) Int. Cl.
*C23C 16/455* (2006.01)
*C23C 16/40* (2006.01)
*C23C 16/44* (2006.01)

(52) U.S. Cl.
CPC ...... *C23C 16/45527* (2013.01); *C23C 16/401* (2013.01); *C23C 16/4408* (2013.01); *C23C 16/45553* (2013.01)

(58) Field of Classification Search
CPC ............ C23C 16/45527; C23C 16/401; C23C 16/4408; C23C 16/45553; C23C 16/045; C23C 16/45536; H01L 21/02164; H01L 21/02211; H01L 21/02219; H01L 21/02274; H01L 21/0228
See application file for complete search history.

(56) References Cited

U.S. PATENT DOCUMENTS

| | | | |
|---|---|---|---|
| 8,187,486 B1 * | 5/2012 | Liu | H01L 21/02063 438/723 |
| 10,043,656 B1 | 8/2018 | Smith et al. | |
| 10,199,212 B2 | 2/2019 | Smith et al. | |
| 2013/0129648 A1 | 5/2013 | Nguyen et al. | |

(Continued)

FOREIGN PATENT DOCUMENTS

| | | |
|---|---|---|
| EP | 1860690 A2 | 11/2007 |
| JP | 2015188087 A | 10/2015 |

(Continued)

*Primary Examiner* — Michael G Miller
(74) *Attorney, Agent, or Firm* — David K. Benson; Versum Materials US, LLC

(57) ABSTRACT

An atomic layer deposition method for depositing a non-conformal silicon and oxygen containing film into surface features comprising vias and/or trenches on one or more substrates.

18 Claims, 1 Drawing Sheet

(56) References Cited

U.S. PATENT DOCUMENTS

| | | |
|---|---|---|
| 2015/0275355 A1 | 10/2015 | Mallikarjunan |
| 2016/0351389 A1* | 12/2016 | Xiao ........................ C07F 7/10 |
| 2018/0223047 A1 | 8/2018 | Xiao |
| 2019/0189431 A1* | 6/2019 | Chandra .................... C07F 7/10 |
| 2019/0203354 A1 | 7/2019 | Smith et al. |

FOREIGN PATENT DOCUMENTS

| | | |
|---|---|---|
| JP | 2018154615 A | 10/2018 |
| WO | 2009039251 A1 | 3/2009 |
| WO | 2020163359 A1 | 8/2020 |

\* cited by examiner

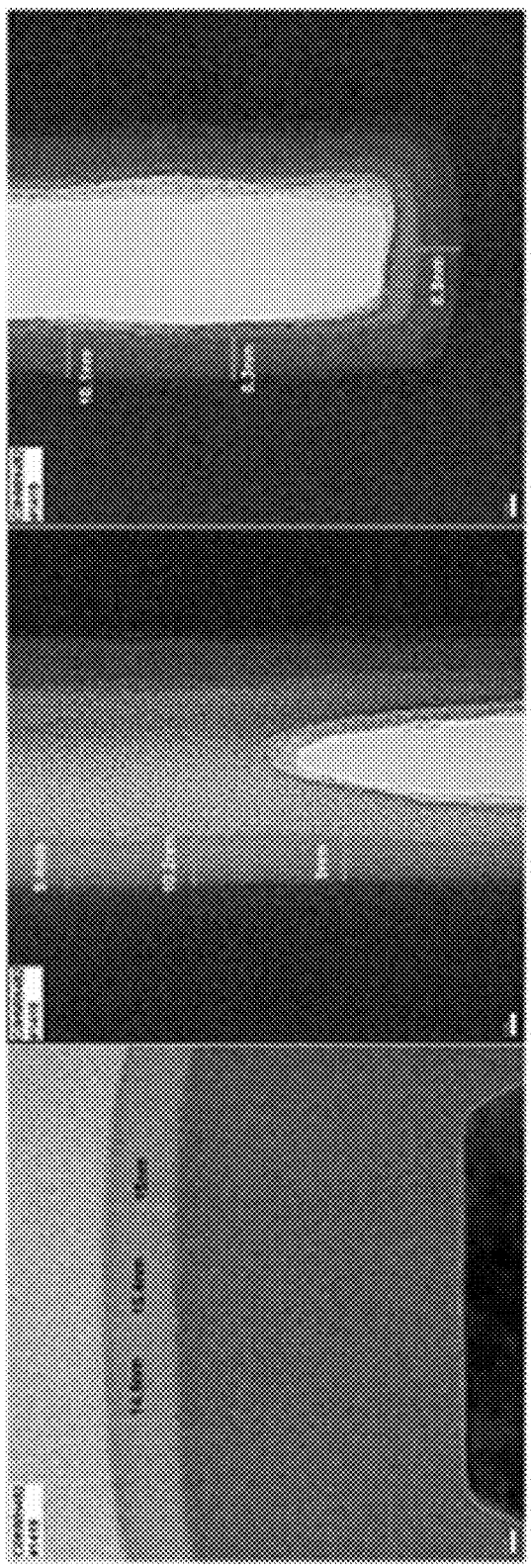

COMPOSITIONS AND METHODS USING SAME FOR NON-CONFORMAL DEPOSITION OF SILICON CONTAINING FILMS

CROSS REFERENCE TO RELATED PATENT APPLICATIONS

The application is a 371 National Entry of International Patent Application PCT/US2020/049315, filed Sep. 4, 2020, which claims the benefit of U.S. Application No. 62/898,047 filed on Sep. 10, 2019. The disclosure of Application No. 62/898,047, and both applications, are hereby incorporated by reference.

FIELD OF THE INVENTION

Described herein is a composition and method for the fabrication of an electronic device. More specifically, described herein are compounds, and compositions and methods comprising same, for non-conformal deposition of a silicon oxide film over semi-conductor features, or for completely filling semi-conductor features comprising vias and/or trenches with a silicon or metal oxide-containing film without defects.

BACKGROUND OF THE INVENTION

There is a need in the art to provide a composition, and a method using the same and employing chemical inhibition and deposition techniques, for depositing a silicon or metal oxide-containing film or combination of thereof, to fill openings on high aspect ratio features on a semiconductor substrate.

US Publication US20190203354 discloses methods and systems for conformality modulation of metal oxide films in atomic layer deposition (ALD) methods using chemical inhibition. The inhibiting precursors for metal oxide deposition may include chelating agents such as diketones.

U.S. Pat. No. 10,199,212 and 10,043,656 disclose methods and apparatuses for selectively depositing a silicon-containing or metal-containing dielectric material on silicon or metal surfaces selective to silicon oxide or silicon nitride materials. Acetyl chloride is used as blocking agent.

BRIEF SUMMARY OF THE INVENTION

The composition and method described herein overcome the problems of the prior art by providing a composition and methods for depositing a non-conformal silicon oxide over features comprising vias and/or trenches or silicon/metal oxide containing film to fill features comprising vias and/or trenches. Film deposition was performed using a typical atomic layer deposition (ALD) method, the method comprises:
a. placing one or more substrates having features comprising vias and/or trenches with hydroxyl groups on the surface into a reactor and heating the reactor to one or more temperatures ranging from ambient temperature to about 700° C. and optionally maintaining the reactor at a pressure of 100 torr or less;
b. introducing into the reactor a first precursor with a formula of $R^1R^2R^3SiX$ (I) wherein $R^1$, $R^2$, $R^3$ are each independently selected from the group consisting of hydrogen, a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_2$ to $C_{10}$ alkenyl group, a $C_2$ to $C_{10}$ alkynyl group, and a $C_4$ to $C_{10}$ aryl group; X is a nitrogen-containing heteroatomic cyclic group to preferentially react with those hydroxyl groups on the top surface area of the features;
c. purging unreacted first precursors away using inert gas;
d. introducing an oxygen source; and
e. purging unreacted oxygen source and by-products using inert gas;
wherein steps b through e are repeated until the features are covered with non-conformal silicon oxide.

In one or more embodiments described above, the oxygen source is selected from the group consisting of oxygen, oxygen plasma, water vapor plasma, a mixture of water and organic amine, hydrogen peroxide, nitrous oxide, ozone, carbon dioxide plasma, carbon monoxide plasma, and combination thereof.

BRIEF DESCRIPTION OF THE DRAWING

FIG. 1 shows the TEM images of non-conformal silicon oxide film growth on a trench using pyrrolyltrimethylsilane (16 seconds of precursor pulse time) at 600° C. described in Example 2, demonstrating non-conformal silicon oxide in the trench, i.e. thicker on the top and thinner in the trench middle and bottom from left TEM image to the right TEM image.

DETAILED DESCRIPTION OF THE INVENTION

Described herein are compositions and processes related to fill a via or trench with a silicon or metal oxide containing film in an atomic layer deposition (ALD) or in an ALD-like process, such as without limitation a cyclic chemical vapor deposition process (CCVD). In this invention, a first precursor having at least one nitrogen-containing heteroatomic cyclic group selected from the group consisting of pyrrolyl, substituted pyrrolyl, 2-pyrrolinyl, substituted pyrrolinyl, imidazolyl, substituted imidazolyl, 2-imidazolinyl, substituted 2-imidazolinyl, pyrazolyl, substituted pyrazolyl,1,2,3-triazolyl, 2-pyrazolinyl, substituted pyrazolinyl, 1,4-dihydropyridinyl, substituted 1,4-dyhydropyridinyl, 1,2-dihydropyridinyl, substituted 1,2-dihydropyridinyl, 1,2,3,4-tetrahydropyridinyl, and substituted 1,2,3,4-tetrahydropyridinyl is used to react with exposed surface hydroxyl groups on the substrate, and preferentially react with hydroxyl groups on the top surface area of the features of a substrate, such as via and trench surface features, and as a result providing non-conformal deposition of silicon oxide over the features. The term "substituted" refers to replacing one or more hydrogen atom in the cyclic group with one or more alkyl groups such as methyl, ethyl, iso-propyl, and n-propyl. The dose of the first precursor will be controlled in order to limit diffusion into the bottom of the features. Therefore, the first precursor will be deposited more onto the substrate surface and top parts of the features than onto the bottom parts of the features, allowing higher film growth near the surface and lower film growth near the bottom of the features. This method of limiting film growth at the lower areas of the trench or other feature allows for openings to remain for a second precursor and oxygen source to completely fill the gap with a film of interest. Not bounded by any theory, it is believed that the Si—N bond in the first precursor having at least one C=C bond connected to the nitrogen atom is much stronger due to delocalization of electrons among C=C—N—Si linkage than a precursor without any C=C bonds connected to the nitrogen atom, making those precursors much less reactive towards hydroxyl groups and thus preferably reacting more with hydroxyl groups disposed toward the top of a feature.

When no passivation agent is used during film growth in the trench, such as in typical ALD conformal film growth, the opening at or near the substrate surface narrows as film growth proceeds during gap-fill. Eventually, this will prohibit further film growth inside the trench and result in porosity.

In one embodiment, the method for non-conformal deposition of silicon oxide on a substrate with features described in this invention comprises:
 a. placing one or more substrates having features comprising vias and/or trenches with hydroxyl groups on the surface into a reactor and heating the reactor to one or more temperatures ranging from ambient temperature to about 700° C. and optionally maintaining the reactor at a pressure of 100 torr or less;
 b. introducing into the reactor a first precursor with a formula of $R^1R^2R^3SiX$ (I) wherein $R^1$, $R^2$, $R^3$ are each independently selected from the group consisting of hydrogen, a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_2$ to $C_{10}$ alkenyl group, a $C_2$ to $C_{10}$ alkynyl group, and a $C_4$ to $C_{10}$ aryl group; X is a nitrogen-containing heteroatomic cyclic group to preferentially react with those hydroxyl groups on the top surface area of the features;
 c. purging unreacted first precursors away using inert gas;
 d. introducing an oxygen source; and
 e. purging unreacted oxygen source and by-products using inert gas
wherein steps b through e are repeated until the features are covered with non-conformal silicon oxide.

In another embodiment, the method for gap-fill of silicon oxide or metal oxide on a substrate with features described in this invention comprises:
 a. placing one or more substrates having features comprising vias and/or trenches with hydroxyl groups on the surface into a reactor and heating the reactor to one or more temperatures ranging from ambient temperature to about 700° C. and optionally maintaining the reactor at a pressure of 100 torr or less;
 b. introducing into the reactor a first precursor with a formula of $R^1R^2R^3SiX$ (I) wherein $R^1$, $R^2$, $R^3$ are each independently selected from the group consisting of hydrogen, a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_2$ to $C_{10}$ alkenyl group, a $C_2$ to $C_{10}$ alkynyl group, and a $C_4$ to $C_{10}$ aryl group; X is a nitrogen-containing heteroatomic cyclic group to preferentially react with those hydroxyl groups on the top surface area of the features;
 c. purging unreacted first precursors away using inert gas;
 d. introducing vapors of a second precursor having at least one organoamino group to react with those unreacted hydroxyl groups;
 e. purging unreacted precursors away using inert gas;
 f. introducing an oxygen source; and
 g. purging unreacted oxygen source and by-products using inert gas;
wherein steps b through g are repeated until the features are filled from the bottom-up of the features. In some embodiments, at least one of $R^1$, $R^2$, $R^3$ is selected from a linear $C_6$ to $C_{10}$ alkyl group, a branched $C_6$ to $C_{10}$ alkyl group, a $C_6$ to $C_{10}$ cyclic alkyl group, a $C_4$ to $C_{10}$ heterocyclic group, a $C_2$ to $C_{10}$ alkenyl group, a $C_2$ to $C_{10}$ alkynyl group, and a $C_4$ to $C_{10}$ aryl group to provide larger foot-print upon reacting with hydroxyl groups on surface of a feature, thus making it difficult for those precursors to enter small vias or trenches while the second precursor having smaller molecular size is selected to react with hydroxyls inside the vias or trenches, promoting better bottom-up fill.

In the formula I above and throughout the description, the term "alkyl" denotes a linear or branched functional group having from 1 to 10 carbon atoms. Exemplary linear alkyl groups include, but are not limited to, methyl, ethyl, n-propyl, butyl, pentyl, and hexyl groups. Exemplary branched alkyl groups include, but are not limited to, iso-propyl, iso-butyl, sec-butyl, tert-butyl, iso-pentyl, tert-pentyl, iso-hexyl, and neo-hexyl. In certain embodiments, the alkyl group may have one or more functional groups attached thereto such as, but not limited to, an alkoxy group such as methoxy, ethoxy, iso-propoxy, and n-propoxy, a dialkylamino group such as dimethylamino or combinations thereof, attached thereto. In other embodiments, the alkyl group does not have one or more functional groups attached thereto. The alkyl group may be saturated or, alternatively, unsaturated.

In the content above and throughout the description, the term "inert gas" denotes an inert gas selected from the group consisting of helium, argon, neon, nitrogen, and combination thereof. In some embodiments, the inert gas in the purging steps (i.e. c, e or g) is same, In other embodiments, the inert gas in the purging steps (i.e. c, e or g) can be different.

In the content above and throughout the description, the term "hydroxyl" denotes hydroxyl groups either on the existing surface or generated during the process from substrates. Examples of suitable substrates include but are not limited to, silicon, $SiO_2$, titanium nitride, tungsten nitride, tantalum nitride, vanadium nitride, metals such as germanium, copper, titanium, tungsten, cobalt, ruthenium, platinum palladium, aluminum and combinations thereof.

In Formula I above and throughout the description, the term "cyclic alkyl" denotes a cyclic functional group having from 3 to 10 carbon atoms. Exemplary cyclic alkyl groups include, but are not limited to, cyclobutyl, cyclopentyl, cyclohexyl, and cyclooctyl groups.

In Formula I above and throughout the description, the term "nitrogen-containing heteroatomic cyclic group" denotes a $C_3$ to $C_{10}$ hetero-cyclic group having at least one C═C bond directly connected to the nitrogen atom. Exemplary nitrogen-containing heteroatomic cyclic groups include, but not limited to, pyrrolyl, substituted pyrrolyl, 2-pyrrolinyl, substituted pyrrolinyl, imidazolyl, substituted imidazolyl, 2-imidazolinyl, substituted 2-imidazolinyl, pyrazolyl, substituted pyrazolyl,1,2,3-triazolyl, 2-pyrazolinyl, substituted pyrazolinyl, 1,4-dihydropyridinyl, substituted 1,4-dyhydropyridinyl, 1,2-dihydropyridinyl, substituted 1,2-dihydropyridinyl, 1,2,3,4-tetrahydropyridinyl, and substituted 1,2,3,4-tetrahydropyridinyl. Examples of such groups include 3-methylpyrrolyl, 2-methylpyrrolyl, 3,4-dimethylpyrrolyl, 3-ethylpyrrolyl, 2,5-dimethylpyrrolyl, 2,4-dimethylpyrrolyl, 2,3-dimethylpyrrolyl, 2,3-dihydro-3-methyl-pyrrolyl, 2,3-dihydro-5-methyl-1h-pyrrolyl, 3,4-dihydro-4-methylpyrrolyl, 2,3-dihydro-2,2-dimethylpyrrolyl, 2,3-dihydro-3,5-dimethylpyrrolyl, 2-methylimidazolyl, 4-methylimidazolyl, 2-ethylimidazolyl, 2,4-dimethylimidazolyl, 4,5-dimethylimidazolyl, 2-methylimidazolinyl, 4-methyl-2-imidazolinyl, 4,4-dimethyl-2-imidazolinyl, 4-methylpyrazolyl, 5-methyl-pyrazolyl, 3-methylpyrazolyl, 5-methyl-1,2,3-triazolyl, 4,5-dimethyl-1,2,3-triazolyl, 4-methyl-4,5-dihydro-pyrazolyl, 5-methyl-2-pyrazolinyl, 3-methyl-2-pyrazolinyl, 1,4-dihydro-4-methylpyridinyl, 1,4-dihydro-2-methylpyridinyl, 1,2,3,4-tetrahydro-5-methylpyridinyl, and 1,2,3,4-tetrahydro-5,6-dimethylpyridinyl.

Table 1 lists non-limiting examples of nitrogen-containing heteroatomic cyclic groups which are capable of being bonded to a silicon atom to form a silicon precursor as the first precursor.

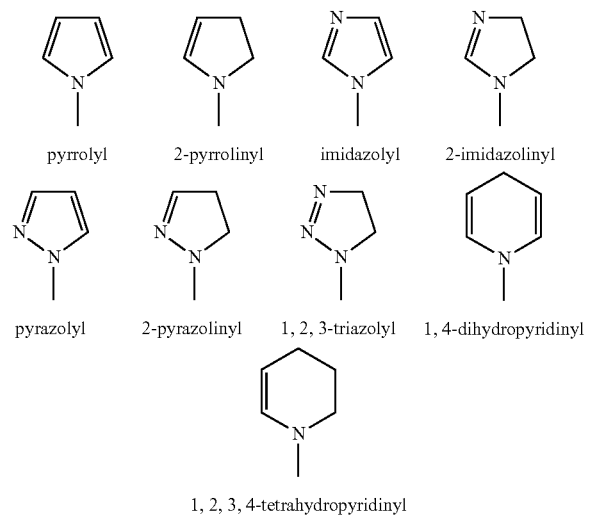

Table 1. Non-limiting examples of nitrogen-containing heteroatomic cyclic groups In Formula I above and throughout the description, the term "alkenyl group" denotes a group which has one or more carbon-carbon double bonds and has from 2 to 10 or from 2 to 8 or from 2 to 6 carbon atoms.

In Formula I above and throughout the description, the term "alkynyl group" denotes a group which has one or more carbon-carbon triple bonds and has from 2 to 10 or from 2 to 8 or from 2 to 6 carbon atoms.

In Formula I above and throughout the description, the term "aryl" denotes an aromatic cyclic functional group having from 3 to 10 carbon atoms, or from 6 to 10 carbon atoms. Exemplary aryl groups include, but are not limited to, phenyl, benzyl, chlorobenzyl, tolyl, and o-xylyl.

The first precursor has at least one C═C bonds connected to the nitrogen atom of organoaminosilane with a formula of $R^1R^2R^3SiX$ (I) wherein $R^1$, $R^2$, $R^3$ are each independently selected from the group consisting of hydrogen, a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_2$ to $C_{10}$ alkenyl group, a $C_2$ to $C_{10}$ alkynyl group, and a $C_4$ to $C_{10}$ aryl group; X is selected from the group consisting of pyrrolyl, substituted pyrrolyl, 2-pyrrolino, substituted pyrrolinyl, imidazolyl, substituted imidazolyl, 2-imidazolinyl, substituted 2-imidazolinyl, pyrazolyl, substituted pyrazolyl, 2-pyrazolinyl, substituted pyrazolino,1,2,3-triazolyl, 1,4-dihydropyridinyl, substituted 1,4-dyhydropyridinyl, 1,2-dihydropyridinyl and substituted 1,2-dihydropyridinyl. In certain embodiments, $R^1$, $R^2$, and $R^3$ are all methyl, as a result, the silicon precursors are suitable for non-conformal thermal or plasma enhanced ALD silicon oxide at temperature of 500° C. or higher, preferably 550° C. or higher, because Si-Me is more stable than Si—H or Si-Et. Examples of the first precursors include but are not limited to pyrrolyltrimethylsilane, pyrrolyidimethyloctylsilane, 2,5-dimethylpyrrolyftrimethylsilane, 2-pyrrolinotrimethylsilane, imidazolyltrimethylsilane, 2-imidazolinotrimethylsilane, pyrazolyltrimethylsilane, 1, 2, 3-triazolyltrimethylsilane, 2-pyrazolinotrimethylsilane.

The second precursor for silicon oxide or metal oxide having at least one organoamino group can be selected from the group consisting of organoaminosilanes, organoaminodisilanes, organoaminotrisilylamines, organoaminosiloxanes, organoaminocyclosiloxanes, and organoaminotitanium, organoaminohafnium, organoaminozirconium, organoaminotantalum, organoaminotungsten, organoaminomolybdenum, organoaminoaluminum, alkylaluminum, metal alkoxides and any other silicon or metal precursors which can be used to deposit silicon oxide, carbon doped silicon oxide, metal oxide.

Examples of organoaminosilanes include, but are not limited to, di-iso-propylaminosilane, di-sec-butylaminosilane, bis(diethylamino)silane, bis(dimethylamino)silane, bis(ethylmethylamino)silane, bis(tert-butylamino)silane, di-iso-propylaminomethylsilane, di-sec-butylaminomethylsilane, dimethylaminodimethylsilane, dimethylaminotrimethylsilane, bis(dimethylamino)methylsilane, tetrakis(dimethylamino)silane, tris(dimethylamino)silane, iso-propylaminotrimethylsilane, tert-butylaminotrimethylsilane, iso-butylaminotrimethylsilane, Cyclohexaminotrimethylsilane, pyrrolidinotrimethylsilane, 2-methylpyrrolidinotrimethylsilane, 2,5-dimethylpyrrolidinotrimethylsilane, piperidinotrimethylsilane, 2,6-dimethylpiperidinotrimethylsilane, 1-methylpiperazinotrimethylsilane, pyrrolyltrimethylsilane, 2,5-dimethylpyrrolyftrimethylsilane, imidazolyltrimethylsilane.

Examples of organoaminodisilanes include, but are not limited to, di-iso-propylaminodisilane, di-sec-butylaminodisilane.

Examples of organoaminotrisilylamines include, but are not limited to, di-iso-propylaminotrisilylamine, diethylaminotrisilylamine, iso-propylaminotrisilylamine, cyclohexylmethylaminotrisilylamine.

Examples of organoaminosiloxanes include but not limited to 1-dimethylamino-pentamethyldisiloxane, 1-diethylamino-pentamethyldisiloxane, 1-ethylmethylamino-pentamethyldisiloxane, 1,3-bis(dimethylamino) tetramethyldisiloxane, 1-dimethylamino-heptamethyltrisiloxane, 1,5-bis(dimethylamino) hexamethyltrisiloxane.

Examples of organoaminocyclosiloxanes include but not limited to 2-dimethylamino-2,4,4,6,6-pentamethylcyclotrisiloxane, 2-diethylamino-2,4,4,6,6-pentamethylcyclotrisiloxane, 2-ethylmethylamino-2,4,4,6,6-pentamethylcyclotrisiloxane, 2-iso-propylamino-2,4,4,6,6-pentamethylcyclotrisiloxane, 2-dimethylamino-2,4,4,6,6,8,8-heptamethylcyclotetrasiloxane, 2-diethylamino-2,4,4,6,6,8,8-heptamethylcyclotetrasiloxane, 2-ethylmethylamino-2,4,4,6,6,8,8-heptamethylcyclotetrasiloxane, 2-iso-propylamino-2,4,4,6,6,8,8-heptamethylcyclotetrasiloxane, 2-dimethylamino-2,4,6-trimethylcyclotrisiloxane, 2-diethylamino-2,4,6-trimethylcyclotrisiloxane, 2-ethylmethylamino-2,4,6-trimethylcyclotrisiloxane, 2-iso-propylamino-2,4,6-trimethylcyclotrisiloxane, 2-dimethylamino-2,4,6,8-tetramethylcyclotetrasiloxane, 2-diethylamino-2,4,6,8-tetramethylcyclotetrasiloxane, 2-ethylmethylamino-2,4,6,8-tetramethylcyclotetrasiloxane, and 2-iso-propylamino-2,4,6,8-tetramethylcyclotetrasiloxane, 2-pyrrolidino-2,4,6,8-tetramethylcyclotetrasiloxane, 2-cyclohexylmethylamino-2,4,6,8-tetramethylcyclotetrasiloxane.

Examples of organoaminotitanium include but not limited to tetrakis(dimethylamino)titanium, tetrakis(diethylamino) titanium, tetrakis(ethylmethylamino)titanium.

Examples of organoaminohafnium include but not limited to tetrakis(dimethylamino)hafnium (TDMAH), tetrakis(diethylamino)hafnium (TDEAH), tetrakis(ethylmethylamino) hafnium (TEMAH), cyclopentadienyltris(dimethylamino) hafnium (CpHf(NMe$_2$)$_3$), methylcyclopentadienyltris (dimethylamino)hafnium (MeCpHf(NMe$_2$)$_3$), ethylcyclopentadienyltris(dimethylamino)hafnium (EtCpHf (NMe$_2$)$_3$), cyclopentadienyltris(dimethylamino)hafnium (CpHf(NMeEt)$_3$), methylcyclopentadienyltris(dimethylamino)hafnium (MeCpHf(NMeEt)$_3$), ethylcyclopentadienyltris (dimethylamino)hafnium (EtCpHf(NMeEt)$_3$), cyclopentadienyltris(dimethylamino)hafnium (CpHf(NEt$_2$)$_3$), methylcyclopentadienyltris(dimethylamino)hafnium (MeCpHf(NEt$_2$)$_3$), ethylcyclopentadienyltris(dimethylamino)hafnium (EtCpHf(NEt$_2$)$_3$), bis(cyclopentadienyl)bis (dimethylamino)hafnium (Cp$_2$Hf(NMe$_2$)$_2$), bis(methylcyclopentadienyl)bis(dimethylamino)hafnium ((MeCp)$_2$Hf (NMe$_2$)$_2$), bis(ethylcyclopentadienyl)bis(dimethylamino) hafnium ((EtCp)$_2$Hf(NMe$_2$)$_2$), bis(cyclopentadienyl)bis (dimethylamino)hafnium (Cp$_2$Hf(NMeEt)$_2$), bis (methylcyclopentadienyl)bis(dimethylamino)hafnium ((MeCp)$_2$Hf(NMeEt)$_2$), bis(ethylcyclopentadienyl)bis(dimethylamino)hafnium ((EtCp)$_2$Hf(NMeEt)$_2$), bis(cyclopentadienyl)bis(dimethylamino)hafnium ((Cp$_2$Hf(NEt$_2$)$_2$), bis(methylcyclopentadienyl)bis(dimethylamino)hafnium ((MeCp)$_2$Hf(NEt$_2$)$_3$), bis(ethylcyclopentadienyl)bis(dimethylamino)hafnium ((EtCp)$_2$Hf(NEt$_2$)$_2$), (N-methyl-2,4-cyclopentadiene-1-ethanamino]bis(dimethylamino)hafnium, (N-ethyl-2,4-cyclopentadiene-1-ethanamino]bis (dimethylamino)hafnium, (N-methyl-2,4-cyclopentadiene-1-ethanamino]bis(diethylamino)hafnium, (N-ethyl-2,4-cyclopentadiene-1-ethanamino]bis(diethylamino)hafnium, (N-methyl-2,4-cyclopentadiene-1-ethanamino]bis(ethylmethylamino)hafnium, (N-ethyl-2,4-cyclopentadiene-1-ethanamino]bis(ethylmethylamino)hafnium.

Examples of organoaminozirconium include but not limited to tetrakis(dimethylamino)zirconium (TDMAZ), tetrakis(diethylamino)zirconium(TDEAZ), tetrakis(ethylmethylamino)zirconium (TEMAZ), cyclopentadienyltris (dimethylamino)zirconium (CpZr(NMe$_2$)$_3$), methylcyclopentadienyltris(dimethylamino)zircnoum (MeCpZr(NMe$_2$)$_3$), ethylcyclopentadienyltris(dimethylamino)zirconium (EtCpZr(NMe$_2$)$_3$), cyclopentadienyttris(dimethylamino)zirconium (CpZr(NMeEt)$_3$), methylcyclopentadienyltris(dimethylamino)zirconium (MeCpZr(NMeEt)$_3$), ethylcyclopentadienyltris(dimethylamino)zirconium (EtCpZr(NMeEt)$_3$), cyclopentadienyttris(dimethylamino) zirconium (CpHf(NEt$_2$)$_3$), methylcyclopentadienyltris(dimethylamino)zirconium (MeCpZr(NEt$_2$)$_3$), ethylcyclopentadienyltris(dimethylamino)zirconium (EtCpZr(NEt$_2$)$_3$), bis (cyclopentadienyl)bis(dimethylamino)zirconium (Cp$_2$Zr (NMe$_2$)$_2$), bis(methylcyclopentadienyl)bis(dimethylamino) zirconium ((MeCp)$_2$Zr(NMe$_2$)$_2$), bis (ethylcyclopentadienyl)bis(dimethylamino)zirconium ((EtCp)$_2$Zr(NMe$_2$)$_2$), bis(cyclopentadienyl)bis(dimethylamino)zirconium (Cp$_2$Zr(NMeEt)$_2$), bis(methylcyclopentadienyl)bis(dimethylamino)zirconium ((MeCp)$_2$Zr (NMeEt)$_2$), bis(ethylcyclopentadienyl)bis(dimethylamino) zirconium ((EtCp)$_2$Zr(NMeEt)$_2$), bis(cyclopentadienyl)bis (dimethylamino)zirconium ((Cp$_2$Zr(NEt$_2$)$_2$), bis(methylcyclopentadienyl)bis(dimethylamino)zirconium ((MeCp)$_2$Zr (NEt$_2$)$_3$), bis(ethylcyclopentadienyl)bis(dimethylamino) zirconium ((EtCp)$_2$Zr(NEt$_2$)$_2$), (N-methyl-2,4-cyclopentadiene-1-ethanamino]bis(dimethylamino) zirconium, (N-ethyl-2,4-cyclopentadiene-1-ethanamino]bis (dimethylamino)zirconium, (N-methyl-2,4-cyclopentadiene-1-ethanamino]bis(diethylamino) zirconium, (N-ethyl-2,4-cyclopentadiene-1-ethanamino]bis (diethylamino)zirconium, (N-methyl-2,4-cyclopentadiene-1-ethanamino]bis(ethylmethylamino)zirconium, (N-ethyl-2,4-cyclopentadiene-1-ethanamino]bis(ethylmethylamino) zirconium.

Examples of organoaminotantalum include but not limited to (tert-butylimino)tris(dimethylamino)tantalum, (tert-butylimino)tris(diethylamino)tantalum, and (tert-butylimino)tris(ethylmethylamino)tantalum.

Examples of organoaminotantalum include but not limited to bis(tert-butylimino)bis(dimethylamino)tungsten, bis (tert-butylimino)bis(diethylamino)tungsten, and bis(tert-butylimino)bis(ethylmethylamino)tungsten.

Examples of organoaminomolybdenum include but not limited to bis(tert-butylimino)bis(dimethylamino)molybdenum, bis(tert-butylimino)bis(diethylamino)molybdenum, and bis(tert-butylimino)bis(ethylmethylamino)molybdenum.

Examples of organoaminoaluminum include but not limited to tris(dimethylamino)aluminum, tris(diethylamino)aluminum, and tris(ethylmethylamino)aluminum.

Examples of alkylaluminum include but not limited to trimethylaluminum, triethylaluminum, tri-tertbutylaluminum (TTBA), bis(2-methyl-2-propanyl)-(2-methyl-1-propanyl)aluminum), (2-methyl-2-propanyl)bis(2-methyl-1-propanyl)aluminum), tris(2-methyl-1-propanyl)aluminum), tri (neopentyl)aluminum.

Examples of metal oxides include but not limited to titanium iso-propoxide, titanium methoxide, titanium ethoxide, aluminum iso-propoxide.

In some embodiments, a directional dry etching can be performed before introducing a second precursor to remove some of as-deposited silicon oxide from the bottom of a feature to facilitate better bottom-up fill, especially for metal oxide.

In some embodiments, the substrate comprises a surface feature. The term "surface feature(s)," or "features" as used herein, means that the substrate or partially fabricated substrate that comprises one or more of the following: pores, trenches, shallow trench isolation (STI), vias, reentrant features, or the like. In one particular embodiment, the surface feature(s) have a width of 100 μm or less, 1 μm in width or less, or 0.5 μm in width or less, or 50 nm in width or less. In this or other embodiments, the aspect ratio (the depth to width ratio) of the surface features, if present, is 2:1 or greater, or 3:1 or greater, or 4:1 or greater, or 10:1 or greater, or 20:1 or greater, or 40:1 or greater. The high aspect ratio is referring to 2:1 or higher with width 100 nm or less, preferably 3:1 or higher with width 100 nm or less, most preferably 4:1 or higher with width 100 nm or less. The trench materials can be selected from Si, SiO$_2$, SiN$_x$, carbon doped silicon oxide or combination of thereof.

In the formula above and throughout the description, the term "linear alkyl" denotes a linear functional group having from 1 to 10, 3 to 10, or 1 to 6 carbon atoms. In the formula above and throughout the description, the term "branched alkyl" denotes a linear functional group having from 3 to 10, or 1 to 6 carbon atoms. Exemplary linear alkyl groups include, but are not limited to, methyl, ethyl, propyl, butyl, pentyl, and hexyl groups. Exemplary branched alkyl groups include, but are not limited to, iso-propyl, iso-butyl, sec-butyl, tert-butyl, iso-pentyl, tert-pentyl, iso-hexyl, and neo-hexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

As mentioned previously, the method described herein may be used to deposit a silicon oxide or metal oxide into surface features comprising vias and/or trenches on at least a portion of a substrate. Examples of suitable substrates include but are not limited to, silicon, $SiO_2$, titanium nitride, tungsten nitride, tantalum nitride, vanadium nitride, metals such as germanium, copper, titanium, tungsten, cobalt, ruthenium, platinum palladium, aluminum and combination thereof.

The films are compatible with a variety of subsequent processing steps such as, for example, chemical mechanical planarization (CMP) and anisotropic etching processes.

The deposited films have applications, which include, but are not limited to, computer chips, optical devices, magnetic information storages, coatings on a supporting material or substrate, microelectromechanical systems (MEMS), nano-electromechanical systems, thin film transistor (TFT), light emitting diodes (LED), organic light emitting diodes (OLED), IGZO, and liquid crystal displays (LCD).

WORKING EXAMPLES

General Film Deposition

Atomic layer deposition of silicon oxide films was conducted using the following precursor: pyrrolyltrimethylsilane. The depositions were performed on a laboratory scale ALD processing tool. The silicon precursor was delivered to the chamber by vapor draw. All gases (e.g., purge and reactant gas or precursor and oxygen source) were preheated to 100° C. prior to entering the deposition zone. Gases and precursor flow rates were controlled with ALD diaphragm valves with high speed actuation. The substrates used in the deposition were 12-inch long silicon strips. For conformality test, pattern wafer coupons were placed on the sample holder for depositions. A thermocouple attached on the sample holder to confirm substrate temperature. Depositions were performed using ozone as oxygen source gas. Deposition parameters are provided in Table I, wherein the term pulse or dose is interchangeable, standing for the step of introducing silicon precursor or oxygen source into the reactor.

TABLE 1

Process for Atomic Layer Deposition of Silicon Oxide Films with Oxygen Source Using Pyrrolyltrimethylsilane

| a | 6 sec | Evacuate reactor and heat up the substrate to about 600° C. | <100 mT |
| b | variable sec | Dose silicon precursor | Reactor pressure typically <2 Torr |
| c | 6 sec | Purge reactor with nitrogen | Flow 1.5 slpm $N_2$ and evacuate for 6 s |
| d | variable sec | Dose oxygen source ozone | 5 Torr, variable |
| e | 6 sec | Purge reactor with nitrogen | Flow 1.5 slpm $N_2$ |

Steps b to e were repeated until a desired thickness was reached. Thickness and Refractive Indices (RI) of the films were measured using a FilmTek 2000SE ellipsometer by fitting the reflection data from the film to a pre-set physical model (e.g., the Lorentz Oscillator model). The growth rate per cycle (GPC) is defined as the thickness of silicon oxide in angstroms (Å) divided by the number of cycles. The precursor growth rate shows saturation with increasing precursor dose time and ozone time at various substrate temperatures, indicating ALD behavior of the precursor. The wet etch rate was performed using 1% solution of 49% hydrofluoric (HF) acid in deionized water (about 0.5 wt % HF). Thermal oxide wafers were used as reference for each batch to confirm solution concentration. Typical thermal oxide wafer Wet Etch Rate (WER) for 0.5 wt. % HF in deionized water solution is 0.5 Å/s. Film thickness before and after etching was used to calculate wet etch rate. The relative WER is calculated as WER of silicon oxide from pyrollyltrimethylsilane/dimethylaminotrimethylsilane divided by WER of thermal oxide measured under the same conditions.

Example 1 Thermal atomic layer deposition of silicon oxide using pyrollyltrimethylsilane/dimethylaminotrimethylsilane and ozoneThermal atomic layer depositions using pyrollyltrimethylsilane and dimethylaminotrimethylsilane were conducted according to Table 1. Table 2 summarizes the growth rates per cycle (GPC, Å/cycle) at substrate temperatures at 600° C., 650° C., and 700° C.

TABLE 2

GPCs of pyrollyltrimethylsilane vs dimethylaminotrimethylsilane

| Precursor | GPC at 600° C. (Å/cycle) | GPC at 650° C. (Å/cycle) | GPC at 700° C. (Å/cycle) |
|---|---|---|---|
| pyrollyltrimethylsilane | 0.55 | 1.13 | 1.66 |
| dimethylaminotrimethylsilane | 1.34 | 1.42 | 1.60 |

Table 2 shows the GPCs at 600° C. and 650° C. for pyrollyltrimethylsilane are lower than those of dimethylaminotrimethylsilane, indicating pyrollyltrimethylsilane is less reactive than dimethylaminotrimethylsilane. Table 3 lists relative wet etch rate (WER) of silicon oxide, indicating silicon oxide deposited from pyrollyltrimethylsilane has lower WER than those from dimethylaminotrimethylsilane.

TABLE 3

Relative WER of pyrrolyltrimethylsilane vs dimethylaminotrimethylsilane

| Precursor | Relative WER at 600° C. | Relative WER at 650° C. | Relative WER at 700° C. |
|---|---|---|---|
| pyrrolyltrimethylsilane | 2.58 | 2.67 | 2.16 |
| dimethylaminotrimethylsilane | 4.00 | 3.54 | 3.01 |

Example 2. Proof of concept to deposit non-conformal silicon oxide film growth on top of trench structure using pyrollyltrimethylsilane and ozone.

The thermal silicon oxide film having non-conformality deposited by pyrollyltrimethylsilane is studied using TEM. The trench size is around 50 nm wide and around 600 nm deep. The deposition was performed at 600° C., precursor pulse times are 2, 16, and 48 seconds, and ozone flow is 20 seconds. The film is non-conformal in the trench, i.e. thicker on the top and thinner in the trench middle and bottom, demonstrating pyrrolyltrimethylsilane is a unique precursor to provide non-conformal deposition, probably due to stronger Si—N bond of pyrollyltrimethylsilane compared to dimethylaminotrimethylsilane. Table 4 shows the averaged film thickness on top, middle and bottom of the trench.

FIG. 1 shows the TEM images of the non-conformal silicon oxide film growth on a trench using pyrrolyltrimethylsilane (16 seconds of precursor pulse time) at 600° C., demonstrating non-conformal silicon oxide in the trench, i.e. thicker on the top and thinner in the trench middle and bottom.

TABLE 4

Film thickness measured at different location of the trench deposited by pyrrolyltrimethylsilane at 600° C.

| Precursor Pulse (seconds) | Reactor Precursor Pressure (Torr) | Top Thickness (nm) | Middle Thickness (nm) | Bottom Thickness (nm) |
|---|---|---|---|---|
| 2 | 0.6 | 10.2 | 5.3 | 4.6 |
| 16 | 1.2 | 15.0 | 9.5 | 8.8 |
| 48 | 0.6 | 18.7 | 8.6 | 9.1 |

The invention claimed is:

1. An atomic layer deposition method for depositing a non-conformal film containing silicon and oxygen into surface features comprising vias and/or trenches on a substrate, the method comprising:
   a. placing the substrate, having exposed hydroxyl groups on the surface features, into a reactor and heating the reactor to at least one temperature ranging from ambient temperature to about 700° C. and optionally maintaining the reactor at a pressure of 100 torr or less;
   b. introducing into the reactor a first precursor with a formula of $R^1R^2R^3SiX$ (I) and including a C=C—N—Si linkage, wherein each of $R^1$, $R^2$, $R^3$ is independently selected from the group consisting of hydrogen, a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_2$ to $C_{10}$ alkenyl group, a $C_2$ to $C_{10}$ alkynyl group, and a $C_4$ to $C_{10}$ aryl group, and X is a nitrogen-containing heteroatomic cyclic group, to react with the exposed hydroxyl groups;
   c. purging any unreacted first precursor from the reactor using inert gas;
   d. introducing an oxygen source into the reactor; and
   e. purging any unreacted oxygen source and any by-products with inert gas,
wherein steps b through e are repeated until the surface features are covered with a predetermined amount of the non-conformal film containing silicon and oxygen, with the non-conformal film being thicker on top and upper portions of the surface features relative to film thickness on middle and bottom regions of the surface features.

2. The method according to claim 1, wherein X is selected from the group consisting of pyrrolyl, substituted pyrrolyl, imidazolyl, substituted imidazolyl, 2-imidazolinyl, substituted 2-imidazolinyl, pyrazolyl, substituted pyrazolyl, 1,2,3-triazolyl, 1,4-dihydropyridinyl, substituted 1,4-dyhydropyridinyl, 1,2-dihydropyridinyl, substituted 1,2-dihydropyridinyl, 1,2,3,4-tetrahydropyridinyl, and substituted 1,2,3,4-tetrahydropyridinyl, wherein when X is substituted, substituents are selected from the group consisting of straight and branched chain alkyl groups.

3. The method according to claim 2, wherein X is selected from the group consisting of 3-methylpyrrolyl, 2-methylpyrrolyl, 3,4-dimethylpyrrolyl, 3-ethylpyrrolyl, 2,5-dimethylpyrrolyl, 2,4-dimethylpyrrolyl, 2,3-dimethylpyrrolyl, 2,3-dihydro-3-methyl-pyrrolyl, 2,3-dihydro-5-methyl-1h-pyrrolyl, 3,4-dihydro-4-methylpyrrolyl, 2,3-dihydro-2,2-dimethylpyrrolyl, 2,3-dihydro-3,5-dimethylpyrrolyl, 2-methylimidazolyl, 4-methylimidazolyl, 2-ethylimidazolyl, 2,4-dimethylimidazolyl, 4,5-dimethylimidazolyl, 2-methylimidazolinyl, 4-methyl-2-imidazolinyl, 4,4-dimethyl-2-imidazolinyl, 4-methylpyrazolyl, 5-methyl-pyrazolyl, 3-methylpyrazolyl, 5-methyl-1,2,3-triazolyl, 4,5-dimethyl-1,2,3-triazolyl, 4-methyl-4,5-dihydro-pyrazolyl, 1,4-dihydro-4-methylpyridinyl, 1,4-dihydro-2-methylpyridinyl, 1,2,3,4-tetrahydro-5-methylpyridinyl, and 1,2,3,4-tetrahydro-5,6-dimethylpyridinyl.

4. The method according to claim 1, wherein the first precursor is at least one selected from the group consisting of pyrrolyltrimethylsilane, pyrrolyldimethyloctylsilane, 2,5-dimethylpyrrolyltrimethylsilane, imidazolyltrimethylsilane, 2-imidazolinotrimethylsilane, pyrazolyltrimethylsilane, and 1, 2, 3-triazolyltrimethylsilane.

5. The method according to claim 1, wherein the oxygen source is selected from the group consisting of oxygen, oxygen plasma, water vapor plasma, a mixture of water and organic amine, hydrogen peroxide, nitrous oxide, ozone, carbon dioxide plasma, carbon monoxide plasma, and combinations thereof.

6. The method according to claim 1, wherein the surface features have a depth to width aspect ratio of at least 2:1.

7. The method according to claim 6, wherein the depth to width aspect ratio is at least 4:1.

8. The method according to claim 1, wherein the surface features have a width of 100 nm or less.

9. An atomic layer deposition method for depositing a film comprising silicon oxide or a metal oxide into surface features comprising vias and/or trenches on a substrate, the method comprising:
   a. placing the substrate, having exposed hydroxyl groups on the surface features, into a reactor and heating the reactor to a temperature ranging from ambient temperature to about 700° C. and optionally maintaining the reactor at a pressure of 100 torr or less;
   b. introducing into the reactor a first precursor with a formula of $R^1R^2R^3SiX$ (I) and including a C=C—N—Si linkage, wherein each of $R^1$, $R^2$, $R^3$ is independently selected from the group consisting of hydrogen, a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_2$ to $C_{10}$ alkenyl group, a $C_2$ to $C_{10}$ alkynyl group, and a $C_4$ to $C_{10}$ aryl group, and X is a nitrogen-containing heteroatomic cyclic group, to react with the exposed hydroxyl groups and form a non-conformal film that is thicker on top and upper portions of the surface features relative to film thickness on middle and bottom regions of the surface features;
   c. purging any unreacted first precursor from the reactor using inert gas;
   d. introducing vapors of a second precursor having at least one organoamino group to react with any unreacted hydroxyl groups;
   e. purging any unreacted second precursor from the reactor using inert gas;
   f. introducing an oxygen source into the reactor; and
   g. purging any unreacted oxygen source and by-products using inert gas, wherein steps b through g are repeated until the features are filled with the silicon oxide or the metal oxide from the bottom-up of the features.

10. The method according to claim 9, wherein X is selected from the group consisting of pyrrolyl, substituted pyrrolyl, imidazolyl, substituted imidazolyl, 2-imidazolinyl, substituted 2-imidazolinyl, pyrazolyl, substituted pyrazolyl, 1,2,3-triazolyl, 1,4-dihydropyridinyl, substituted 1,4-dyhydropyridinyl, 1,2-dihydropyridinyl, substituted 1,2-dihydropyridinyl, 1,2,3,4-tetrahydropyridinyl, and substituted 1,2,3,4-tetrahydropyridinyl, wherein when X is substituted, substituents are selected from the group consisting of straight and branched chain alkyl groups.

11. The method according to claim 10, wherein X is selected from the group consisting of 3-methylpyrrolyl, 2-methylpyrrolyl, 3,4-dimethylpyrrolyl, 3-ethylpyrrolyl, 2,5-dimethylpyrrolyl, 2,4-dimethylpyrrolyl, 2,3-dimethylpyrrolyl, 2,3-dihydro-3-methyl-pyrrolyl, 2,3-dihydro-5-methyl-1h-pyrrolyl, 3,4-dihydro-4-methylpyrrolyl, 2,3-dihydro-2,2-dimethylpyrrolyl, 2,3-dihydro-3,5-dimethylpyrrolyl, 2-methylimidazolyl, 4-methylimidazolyl, 2-ethylimidazolyl, 2,4-dimethylimidazolyl, 4,5-dimethylimidazolyl, 2-methylimidazolinyl, 4-methyl-2-imidazolinyl, 4,4-dimethyl-2-imidazolinyl, 4-methylpyrazolyl, 5-methylpyrazolyl, 3-methylpyrazolyl, 5-methyl-1,2,3-triazolyl, 4,5-dimethyl-1,2,3-triazolyl, 4-methyl-4,5-dihydro-pyrazolyl, 1,4-dihydro-4-methylpyridinyl, 1,4-dihydro-2-methylpyridinyl, 1,2,3,4-tetrahydro-5-methylpyridinyl, and 1,2,3,4-tetrahydro-5,6-dimethylpyridinyl.

12. The method according to claim 9, wherein the first precursor is at least one selected from the group consisting of pyrrolyltrimethylsilane, pyrrolyldimethyloctylsilane, 2,5-dimethylpyrrolyltrimethylsilane, 2-pyrrolinotrimethylsilane, imidazolyltrimethylsilane, 2-imidazolinotrimethylsilane, pyrazolyltrimethylsilane, 1, 2, 3-triazolyltrimethylsilane.

13. The method according to claim 9, wherein the oxygen source is selected from the group consisting of oxygen, oxygen plasma, water vapor plasma, a mixture of water and organic amine, hydrogen peroxide, nitrous oxide, ozone, carbon dioxide plasma, carbon monoxide plasma, and combinations thereof.

14. The method according to claim 9, wherein the second precursor is selected from the group consisting of organoaminosilanes, organoaminodisilanes, organoaminotrisilylamines, organoaminosiloxanes, organoaminocyclosiloxanes, and organoaminotitanium, organoaminohafnium, organoaminozirconium, organoaminotantalum, organoaminotungsten, organoaminomolybdenum, organoaminoaluminum, alkylaluminum, and metal alkoxides.

15. The method according to claim 14, wherein the second precursor is an organoaminosilane selected from the group consisting of di-iso-propylaminosilane, di-sec-butylaminosilane, bis(diethylamino) silane, bis(dimethylamino) silane, bis(ethylmethylamino) silane, bis(tert-butylamino) silane, di-iso-propylaminomethylsilane, di-sec-butylaminomethylsilane, dimethylaminodimethylsilane, dimethylaminotrimethylsilane, bis(dimethylamino)methylsilane, tetrakis(dimethylamino) silane, tris(dimethylamino) silane, iso-propylaminotrimethylsilane, tert-butylaminotrimethylsilane, iso-butylaminotrimethylsilane, Cyclohexaminotrimethylsilane, pyrrolidinotrimethylsilane, 2-methylpyrrolidinotrimethylsilane, 2,5-dimethylpyrrolidinotrimethylsilane, piperidinotrimethylsilane, 2,6-dimethylpiperidinotrimethylsilane, 1-methylpiperazinotrimethylsilane, pyrrolyltrimethylsilane, 2,5-dimethylpyrrolyltrimethylsilane, and imidazolyltrimethylsilane.

16. The method according to claim 9, wherein the surface features have a depth to width aspect ratio of at least 2:1.

17. The method according to claim 16, wherein the depth to width aspect ratio is at least 4:1.

18. The method according to claim 9, wherein the surface features have a width of 100 nm or less.

* * * * *